(12) United States Patent
Chen et al.

(10) Patent No.: US 7,254,029 B2
(45) Date of Patent: Aug. 7, 2007

(54) PRINTED CIRCUIT BOARD WITH A HEAT DISSIPATION DEVICE

(75) Inventors: Yong-Dong Chen, Shenzhen (CN); Guang Yu, Shenzhen (CN); Shin-Hsuu Wung, Tu-Cheng (TW); Chun-Chi Chen, Tu-Cheng (TW); Hsieh-Kun Lee, Tu-Cheng (TW)

(73) Assignees: Fu Zhun Precision Industry (Shenzhen) Co., Ltd., Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 52 days.

(21) Appl. No.: 11/265,367

(22) Filed: Nov. 1, 2005

(65) Prior Publication Data

US 2007/0097625 A1 May 3, 2007

(51) Int. Cl.
*H05K 7/20* (2006.01)
(52) U.S. Cl. ........................ 361/707; 361/687; 361/719
(58) Field of Classification Search ................ 361/687, 361/719, 690, 707, 720, 704, 714
See application file for complete search history.

(56) References Cited

U.S. PATENT DOCUMENTS

| 5,459,639 | A | 10/1995 | Izumi |
| 6,000,125 | A | 12/1999 | Kang |
| 6,710,691 | B2 * | 3/2004 | Yu et al. ........................ 336/55 |
| 6,750,084 | B2 * | 6/2004 | Delheimer .................. 438/117 |
| 6,917,523 | B2 * | 7/2005 | Summers et al. ............ 361/719 |
| 7,038,910 | B1 * | 5/2006 | Hodge et al. ................ 361/690 |

FOREIGN PATENT DOCUMENTS

| CN | 2621311 Y | 6/2004 |
| CN | 2682473 Y | 3/2005 |
| JP | 2000332171 A | * 11/2000 |

* cited by examiner

*Primary Examiner*—Michael C. Zarroli
(74) *Attorney, Agent, or Firm*—Morris Manning & Martin LLP; Tim Tingkang Xia, Esq.

(57) ABSTRACT

An electronic assembly includes a printed circuit aboard, a CPU, an electronic component and a thermal pad attached to the printed circuit board. The CPU and the electronic component are located on a first face of the printed circuit board. The electronic component is located near the CPU. The thermal pad is attached to a second face opposite to the first face of the printed circuit board and located just below the electronic component.

8 Claims, 2 Drawing Sheets

PRINTED CIRCUIT BOARD WITH A HEAT DISSIPATION DEVICE

BACKGROUND

1. Field

This invention is related to a printed circuit board with a heat dissipation device, and particularly to a printed circuit board with a heat dissipation device in use for dissipating heat generated by electronic components located beside a central processing units (CPU) on the printed circuit board.

2. Related Art

It is well known that, during operation of a computer, electronic components arranged on a printed circuit board in a computer enclosure frequently generate large amounts of heat. The heat must be quickly removed from the electronic component to prevent it from becoming unstable or being damaged.

Typically, heat dissipation devices are attached to outer surfaces of some electronic devices which have sufficient area for receiving the heat dissipation devices, such as the CPU (central processing unit). However, some electronic components, such as Mosfets (metal oxide semiconductor field effect transistors) located beside the CPU, which have small figures thereof have insufficient area to receive heat dissipation devices special for them. Conventionally, the Mosfet dissipates its heat by means of a fan of the heat dissipation device for the CPU. However, due to shield of components such as a heat sink of the heat dissipation device of the CPU, the airflow provided by the fan has very limited part reaching the Mosfets. Consequently, a little of heat generated by the Mosfets is removed, considerably much of the heat still accumulates on the Mosfets. Therefore, the Mosfets needs an effective heat dissipation solution for them.

SUMMARY

Accordingly, what is needed is to provide a printed circuit board with a heat dissipation device having effective heat dissipation capacity for small electronic components such as Mosfets located beside a CPU.

An electronic assembly in accordance with an embodiment of the present invention comprises a printed circuit aboard, a CPU, an electronic component and a thermal pad attached to the printed circuit board. The printed circuit board has opposite first and second faces. The CPU and the electronic component are mounted on the first face of the printed circuit board. The electronic component is arranged beside the CPU. The thermal pad is thermally attached to the second face of the printed circuit board and opposite to the electronic component. In a further embodiment, the thermal pad has a bottom face thermally engaging with an enclosure in which the electronic assembly is mounted. In a still further embodiment of the present invention, the thermal pad is attached with a heat sink.

Other advantages and novel features of the present invention will be drawn from the following detailed description of preferred embodiments of the present invention with the attached drawings, in which:

DETAILED DESCRIPTION

Figure 1:
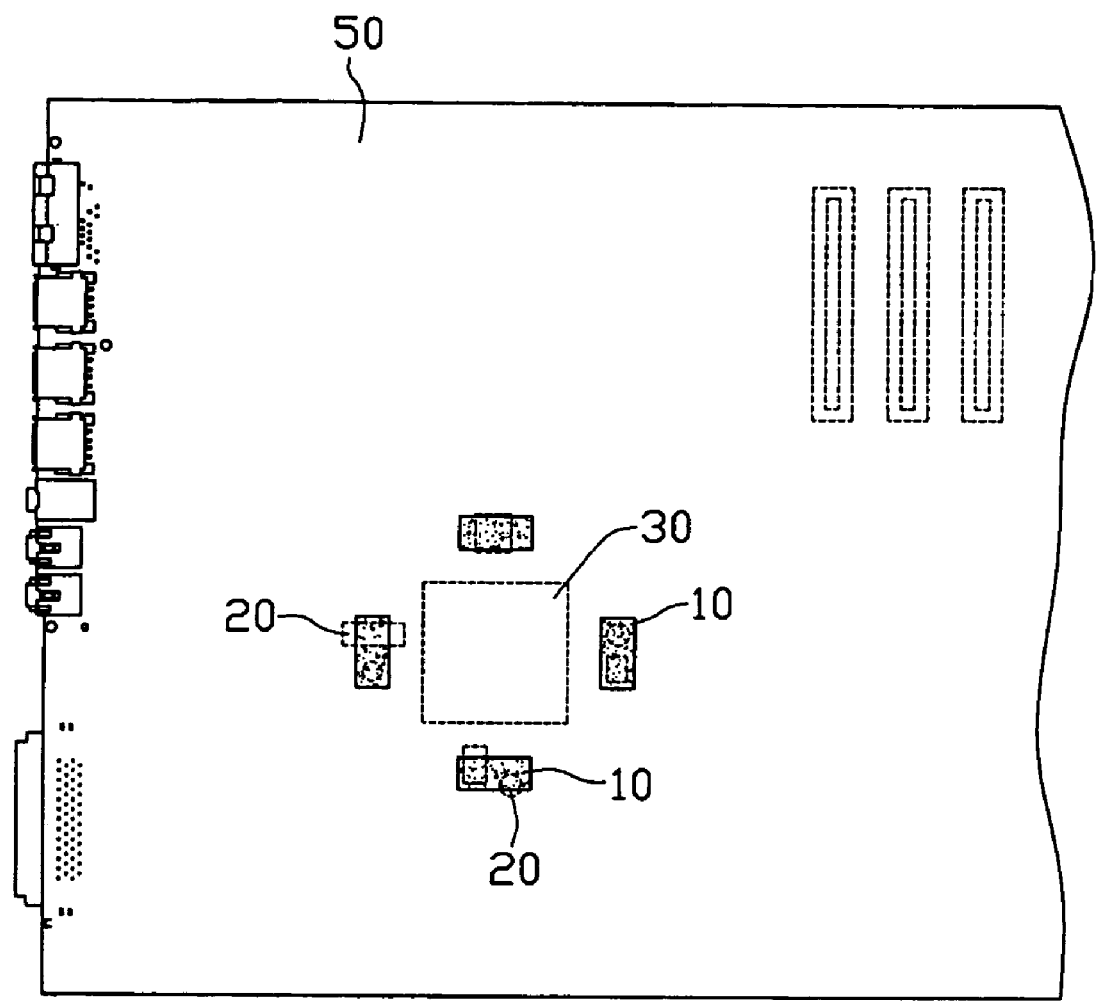
FIG. 1 is a bottom view of a printed circuit board with a heat dissipation device in accordance with a first embodiment of the present invention.

Referring to FIG. 1, an electronic assembly comprises a printed circuit board 50 in a computer enclosure (not shown), a CPU 30 located on the printed circuit board 50, a plurality of small electronic components such as Mosfets 20 located beside the CPU 30 on the printed circuit board 50, and a heat dissipation device attached to the printed circuit board 50.

The printed circuit board 50 has a top face and a bottom face opposite to the top face. The Mosfets 20 and the CPU 30 are located on the top face of the printed circuit board 50. A conventional cooler (not shown) consisting of a heat sink and a fan on the heat sink can be attached to a top face of the CPU 30 to thereby dissipate heat from the CPU 30. An airflow generated by the fan can also blow to the Mosfets 20 to take a part of heat from the Mosfets 20. In this case, the heat dissipation device is a plurality of thermal pads 10. Each of the thermal pads 10 is thermally conductive and electrically insulative. Each of the thermal pads 10 comprises an adhesive layer (not labeled) at a top thereof. The adhesive layer of each of the thermal pads 10 is adhered to the bottom face of the printed circuit board 50 opposite to a corresponding Mosfet 20 on the top face of the printed circuit board 50. Thus, the thermal pads 10 are attached to a bottom face of the printed circuit board 50 just below the Mosfets 20, respectively.

According to the first embodiment of the present invention, when the Mosfets 20 work, the heat generated by them first reaches the printed circuit board 50, then is absorbed by the thermal pads 10 and finally is dissipated to ambient air by the thermal pads 10.

Table 1 as below shows temperature data obtained from a laboratory tests for Mosfets 20 under condition that the printed circuit board 50 is with heat dissipation device of the present invention and without the heat dissipation device of the present invention. The tests were conducted with the environment temperature being Ta. Tc represents the temperature that the Mosfets operate under the condition that the printed circuit board is with or without the heat dissipation device of the present invention. The table shows that the temperatures of the printed circuit board with the heat dissipation device in accordance with the present invention is significantly lower than those without the heat dissipation device. That is to say, the heat dissipation device in accordance with the present invention improves the heat dissipation of the Mosfets 20.

TABLE 1

| CPU | Intel Prescott 3.6 GHz E-stepping (LGA775) |
|---|---|
| CPU Fan | Delta AFB08 12SHD-P53Z (4300 RPM) |
| System Fan | Sunon KDE1209PTV3 |

| Sample | Printed circuit board with the heat dissipation device of the present invention | Printed circuit board without the heat dissipation device of the present invention |
|---|---|---|
| Ta (° C.) | 35.1 | 35.1 |
| Tc (° C.) | | |
| 1 | 78.1 | 80.3 |
| 2 | 94.5 | 99.6 |
| 3 | 77.9 | 84.1 |
| 4 | 90.2 | 98.7 |
| 5 | 86.0 | 96.2 |
| 6 | 84.7 | 91.3 |

TABLE 1-continued

| 7 | 90.7 | 97.4 |
| 8 | 85.0 | 92.7 |

Figure 2:
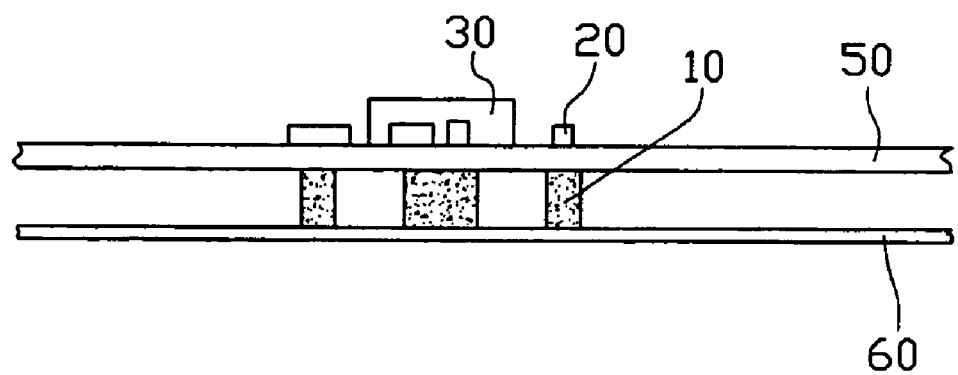
FIG. 2 is a side view of a printed circuit board with a heat dissipation device in accordance with a second embodiment of the present invention.

Referring to FIG. 2, preferably, the thermal pads 10 have ends opposite the adhesive layer thereof thermally contacting a computer enclosure 60. Therefore, via the thermal pads 10, the heat generated by the Mosfets 20 is further conducted to the computer enclosure 60 to be dissipated to ambient air outside the computer enclosure 60, whereby heat dissipation area for the Mosfets 20 is increased and heat dissipation capacity is further improved.

Figure 3:
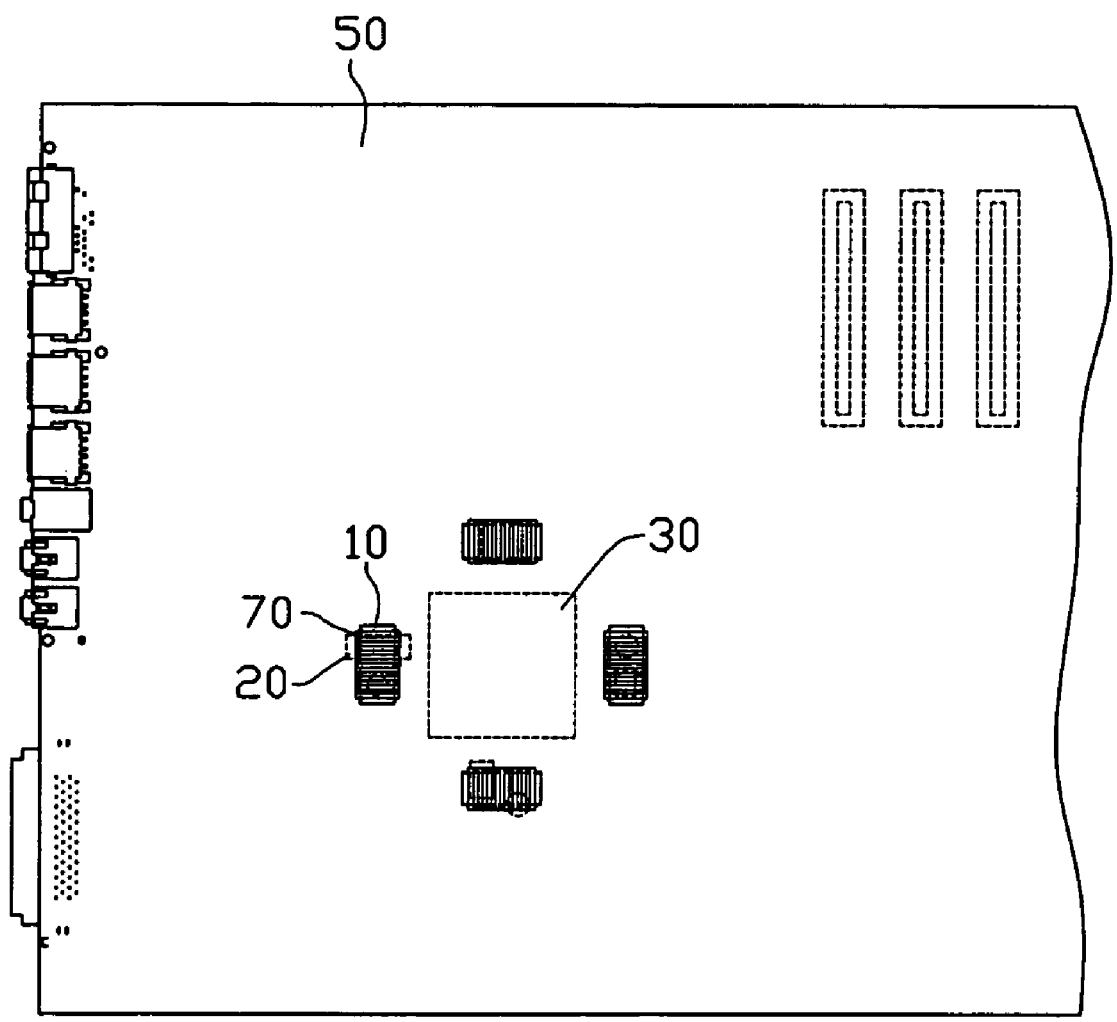
FIG. 3 is a view similar to FIG. 1, but showing a printed circuit board with a heat dissipation device in accordance with a third embodiment of the present invention.

Referring to FIG. 3, basing on the printed circuit board with the heat dissipation device of the first embodiment of the present invention, a heat sink 70 comprising a plurality of heat dissipating fins (not labeled) is thermally attached to each of the thermal pads 10 at a bottom face of each of the thermal pads 20, opposite to the Mosfet 20. According to the embodiment, part of the heat in the thermal pads 10 is conducted to the heat sink 70 to be dissipated by the fins, therefore, the heat dissipating capacity is further improved.

It is to be understood, however, that even though numerous characteristics and advantages of the present invention have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A printed circuit board assembly comprising:
    a printed circuit board having a top and a bottom face;
    a plurality of electronic components located on the top face of the printed circuit board;
    a plurality of thermal pads thermally attached to the bottom face of the printed circuit board and opposite to the electronic components, respectively;
    a CPU mounted on the top face of the printed circuit board, wherein the electronic components are located beside the CPU; and
    a plurality of heat sinks each being thermally attached to each of the thermal pads, wherein each of the thermal pads is thermally conductive and electrically insulative.

2. The printed circuit board assembly of claim 1 further comprising an enclosure, wherein the thermal pads thermally contact the enclosure.

3. The printed circuit board assembly of claim 1, wherein each of the heat sinks comprises a plurality of heat dissipating fins.

4. A printed circuit board assembly comprising:
    a printed circuit board having a first and a second face;
    a CPU located on the first face of the printed circuit board;
    an electronic component arranged on the first face of the printed circuit board and beside the CPU;
    a thermal pad thermally attached to the second face of the printed circuit board and opposite to the electronic component; and
    a heat sink thermally attached to the thermal pad;
    wherein the thermal pad is thermally conductive and electrically insulative.

5. The printed circuit board assembly of claim 4 further comprising a computer enclosure, wherein the thermal pad thermally contacts the computer enclosure.

6. The printed circuit board assembly of claim 4, wherein the heat sink comprises a plurality of heat dissipating fins.

7. An electronic assembly comprising:
    a printed circuit board having top and bottom surfaces;
    a first heat-generating electronic component being mounted on the top surface of the printed circuit board;
    at least a second heat-generating electronic component being mounted on the top surface of the printed circuit board and near the first heat-generating electronic component, wherein heat generated by the at least a second heat-generating electronic component is less than that generated by the first heat-generating electronic component; and
    at least a thermally conductive and electrically insulative pad being attached to the bottom surface of the printed circuit board just below the at least a second heat-generating electronic component; and
    a heat sink attached to the at least a pad.

8. The electronic assembly of claim 7 further comprising an enclosure enclosing the printed circuit board, wherein the at least a pad contacts with the enclosure.

* * * * *